United States Patent
Lin et al.

(10) Patent No.: US 7,629,854 B2
(45) Date of Patent: Dec. 8, 2009

(54) SWITCH-CAPACITOR LOOP FILTER FOR PHASE LOCK LOOPS

(75) Inventors: Chia-Liang Lin, Union City, CA (US); Gerchih Chou, San Jose, CA (US); Chi-Kung Kuan, Fremont, CA (US)

(73) Assignee: Realtek Semiconductor Corp. (TW)

( * ) Notice: Subject to any disclaimer, the term of this patent is extended or adjusted under 35 U.S.C. 154(b) by 57 days.

(21) Appl. No.: 11/601,303

(22) Filed: Nov. 17, 2006

(65) Prior Publication Data
US 2007/0126514 A1    Jun. 7, 2007

Related U.S. Application Data

(60) Provisional application No. 60/741,119, filed on Dec. 1, 2005.

(51) Int. Cl.
*H03L 7/085*    (2006.01)
*H03L 7/093*    (2006.01)
*G06F 7/64*    (2006.01)

(52) U.S. Cl. ............... 331/17; 327/337; 327/554
(58) Field of Classification Search ......... 327/337, 327/554; 331/17
See application file for complete search history.

(56) References Cited

U.S. PATENT DOCUMENTS

| | | | | |
|---|---|---|---|---|
| 4,329,599 A | * | 5/1982 | Gregorian et al. | 327/554 |
| 4,344,050 A | * | 8/1982 | Callahan | 333/173 |
| 4,375,625 A | * | 3/1983 | Lee | 333/213 |
| 4,446,438 A | * | 5/1984 | Chang et al. | 327/337 |
| 4,558,292 A | * | 12/1985 | Sasaki et al. | 333/173 |
| 5,281,866 A | * | 1/1994 | Rundel | 327/544 |
| 7,019,571 B2 | * | 3/2006 | Lim | 327/157 |
| 7,145,400 B2 | * | 12/2006 | Horan | 331/17 |
| 7,327,182 B2 | | 2/2008 | Dosho | |
| 7,459,964 B2 | | 12/2008 | Dosho | |
| 2006/0226896 A1 | | 10/2006 | Dosho | |
| 2007/0205825 A1 | | 9/2007 | Dosho | |

FOREIGN PATENT DOCUMENTS

WO    WO 2005/093952    * 10/2005

OTHER PUBLICATIONS

Bietti, I., et al., "An UMTS ΣΔ Fractional Synthesizer With 200kHz Bandwidth and -128dBc/Hz @ 1MHz Using Spurs Compensation and Linearization Techniques", *IEEE 2003 Custom Integrated Circuits Conference*, (2003), 463-466.

(Continued)

*Primary Examiner*—Robert Pascal
*Assistant Examiner*—Levi Gannon
(74) *Attorney, Agent, or Firm*—Schwegman, Lundberg & Woessner, P.A.

(57) ABSTRACT

A switch-capacitor loop filter is used to generate a control voltage for a voltage-controlled oscillator (VCO) in a phase lock loop (PLL). The switch-capacitor circuit works in a multi-phase manner including at least two non-overlapping phases: a sampling phase and a transfer phase. During the sampling phase, the current representing the phase difference between the reference clock and the feedback clock of the PLL is integrated by a sampling capacitor. During the transfer phase, the charge stored on the sampling capacitor is transferred to a load capacitor. The timing for controlling the switch-capacitor function is derived from the reference clock.

41 Claims, 5 Drawing Sheets

OTHER PUBLICATIONS

Menninger, S. E., et al., "A Fractional-*N* Frequency Synthesizer Architecture Utilizing a Mismatch Compensated PFD/DAC Structure for Reduced Quantization-Induced Phase Noise", *IEEE Transactions on Circuits and Systems-II: Analog and Digital Signal Processing*, 50(11), (Nov. 2003), 839-849.

Pamarti, S., et al., "A Wideband 2.4-GHz Delta-Sigma Fractional-*N* PLL With 1-Mb/s In-Loop Modulation", *IEEE Journal on Solid-State Circuits*, 39(1), (Jan. 2004), 49-62.

Bietti, I., et al., "An UMTS Sigma-Delta fractional synthesizer with 200kHz bandwidth and -128dBc/Hz @ 1MHz using spurs compensation and linearization techniques", *IEEE 2003 Custom Integrated Circuits Conference*, 0-7803-7842-3/03/$17.00 @ 2003 IEEE (Mar. 2003), 463-466.

Meninger, S., et al., "A Fractional-N Frequency Synthesizer Architecture Utilizing a Mismatch Compensated PFD/DAC Structure for Reduced Quantization-Induced Phase Noise", *IEEE Transactions on Circuits and Systems—II: Analog and Digital Signal Processing*, vol. 50, No. 11 (Nov. 2003), 839-849.

Pamarti, S., et al., "A Wideband 2.4-GHz Delta-Sigma Fractional-N. PLL With 1-Mb/s In-Look Modulation", *IEEE Journal of Solid-State Circuits*, vol. 39, No. 1 (Jan. 2004), 49-62.

* cited by examiner

SWITCH-CAPACITOR LOOP FILTER FOR PHASE LOCK LOOPS

This application claims priority under 35 U.S.C. 119(e) to U.S. Provisional Patent Application No. 60/741,119, filed Dec. 1, 2005, which application is incorporated herein by reference and made a part hereof.

BACKGROUND OF THE INVENTION

1. Field of the Invention

The present invention relates generally to phase lock loops, and more particularly, but not exclusively, to methods and apparatus for a phase lock loop with a switch-capacitor loop filter.

2. Description of Background Art

As depicted in FIG. 1, a typical phase lock loop (PLL) based frequency synthesizer 100 includes a phase/frequency detector (PFD) 110, a charge pump (CP) circuit 120, a loop filter (LF) 130, and a voltage controlled oscillator (VCO) 140. The PFD 110 compares a reference clock and a feedback clock generated by the VCO to determine the phase difference. The PFD 110 outputs two logical signals, UP and DN signals to represent the phase difference between the two clocks. Each time a phase comparison is made, an UP signal pulse or a DN signal pulse is generated. If the reference clock is leading the feedback clock (in terms of clock phase), an UP pulse is generated. Otherwise, a DN pulse is generated. The width of the UP/DN pulse is proportional to the phase difference between the two clocks. The two logical signals UP and DN are converted into a current signal using the CP circuit 120. For example, the CP circuit 120 generates a positive (i.e. out-going) current pulse in response to a UP pulse, and generates a negative (i.e. in-coming) current pulse in response to a DN pulse. The output of the CP circuit 120 is connected to the LF 130, which typically includes a resistor in series with a capacitor to convert the output current from the CP circuit into a voltage. The output voltage from the LF circuit 130 is passed to the VCO 140 and used to control the frequency and accordingly the phase of the output clock generated by the VCO 140. The output clock of the VCO 140 is used as the feedback clock and provided to the PFD 110. The phase of the feedback clock is then compared with that of the reference clock by the PFD. A closed-loop control system is thus established to adjust the frequency/phase of the VCO 140 to track the frequency/phase of the reference clock. In steady state, the frequency of the output clock of the VCO 140 will be exactly the same as that of the reference clock.

An exemplary timing diagram shown in FIG. 2 illustrates a problem, referred to as "non-uniform sampling," which exists in prior art phase lock loops (PLL) but is rarely discussed or addressed. When the reference clock leads the feedback clock, an UP pulse is generated; the UP pulse rises at the rising edge of the reference clock and falls at the rising edge of the feedback clock (see pulses 210 and 220). When the feedback clock leads the reference clock, a DN pulse is generated; the DN pulse rises at the rising edge of the feedback clock and falls at the rising edge of the reference clock (see pulses 230 and 240). The UP pulse always comes after the rising edge of the reference clock. On the other hand, the DN pulse always comes before the rising edge of the reference clock. The reference clock is usually a very stable clock, where the rising edges occur very regularly. Therefore, the timing and thus the effective sampling instant of a UP pulse differ from those of a DN pulse. The non-uniform sampling is a highly nonlinear phenomenon and results in increase of phase noise in the PLL output. This problem, however, is rarely discussed or addressed in prior art, because in steady state the frequency/phase of the VCO has been tracking well with that of the reference clock, the UP/DN pulses are thus very short, and therefore the non-uniform sampling problem is usually negligible. This problem, however, becomes an important source of performance degradation in an fractional-N frequency synthesizer.

A frequency synthesizer is an important application of PLL. A frequency synthesizer works in exactly the same manner as a general PLL shown in FIG. 1 and described above, except that we introduce a divide-by-N circuit (not shown in FIG. 1) into system such that the output clock of the VCO 140 is provided to the divide-by-N circuit to generate the feedback clock, instead of directly using the output clock of the VCO 140 as the feedback clock. For every N cycles of the VCO 140 output clock, the divide-by-N circuit generates a cycle of the feedback clock. The phase of the feedback clock, which is the output of the divide-by-N circuit, is then input into the PFD 110. The PFD 110 compares the feedback clock from the divide-by-N circuit with that of the reference clock. A closed-loop control system is thus established to adjust the frequency/phase of the VCO 140, and thus accordingly the frequency/phase of the feedback clock, to track the frequency/phase of the reference clock. In steady state, the frequency of the feedback clock will be the same as that of the reference clock, and therefore the frequency of the output clock of the VCO 140 will be N times of that of the reference clock.

The divide-by-N circuit for frequency synthesizer can be conveniently implemented using a divide-by-N counter if N is an integer. If N is a fractional number, a straight implementation using a counter with a fixed divisor value will not work, since the divisor value of a counter needs to be an integer. To implement a fractional N, say $N=N_{int}+\alpha$, where $N_{int}$ is an integer and $\alpha$ is a fractional number between 0 and 1, the divisor value for the counter is dynamically shuffled. For example, the divisor value is dynamically shuffled between $N_{int}$ and ($N_{int}+1$); the effective divisor value will be $N=N_{int}+\alpha$ as long as the probability of having the divisor value of ($N_{int}+1$) is $\alpha$ (and the probability of having $N_{int}$ is $(1-\alpha)$). In some prior art devices, a delta-sigma modulator is often used to dynamically shuffle the divisor value.

Dynamically shuffling the divisor value effectively achieves a fractional N division. However, this shuffling causes elongated UP and DN pulses, which result in elongated current pulses from the CP circuit and consequently cause excessive phase changes to the output clock of the VCO. As a result, the output clock of the VCO contains excessive phase noises albeit the mean frequency is correctly N times that of the reference clock. The excessive phase noise problem, fortunately, can be alleviated using the delta-sigma modulator. Using the delta-sigma modulator to shuffle the divisor value, we spectrally shape the excessive phase noise caused by the shuffling. Consequently, the phase noise mainly consists of high frequency components and can be effectively attenuated by the loop filter. However, the aforementioned non-uniform sampling problem becomes very significant due to elongated UP/DN pulses. The nonlinearity due to non-uniform sampling causes an inter-modulation among the high-frequency phase noises. As a result, there will be a significant increase in low-frequency phase noises that cannot be filtered by the loop filter.

What is needed is a method to alleviate the non-uniform sampling problem, in particular for fractional-N synthesizer applications.

SUMMARY

In an embodiment, a phase locking method is disclosed, the method including: receiving a reference signal and a feedback signal; detecting a phase difference between the reference signal and the feedback signal; converting the phase difference into a current signal; processing the current signal using a switch-capacitor circuit comprising a sampling capacitor, a load capacitor, and a plurality of switches; using an output of the switch-capacitor circuit to control a variable oscillator; generating the feedback signal using an output of the variable oscillator; generating a plurality of timing signals based on a timing of the reference signal; and controlling said switches using said timing signals. The switches are controlled so that the switch-capacitor circuit works in a multi-phase manner, where there are at least two phases that are non-overlapping. In a first phase, the sampling capacitor integrates the current signal through a first switch. In a second phase, the sampling capacitor transfers charge to the load capacitor through a second switch. In an embodiment, an amplifier is used in the switch-capacitor circuit to facilitate the charge transfer.

In an embodiment, a phase lock loop (PLL) is disclosed, the PLL including: a phase detector for receiving a reference clock having a period T and a feedback clock and for generating a plurality of logical signals to represent a phase difference between the reference clock and the feedback clock; a charge pump for converting the logical signals into a current signal; a switch-capacitor circuit including a first sampling capacitor, a load capacitor, and a plurality of switches controlled by a plurality of cyclic control signals, respectively, for converting the current signal into a voltage signal; a variable oscillator controlled by the voltage signal for generating an output clock and the feedback clock; and a control generator for generating the cyclic control signals based on a timing defined by the reference clock. The switches are controlled so that the switch-capacitor circuit works in a multi-phase manner, where there are at least two phases that are non-overlapping. In a first phase, the sampling capacitor integrates the current signal through a first switch. In a second phase, the sampling capacitor transfers charge to the load capacitor through a second switch. In an embodiment, an amplifier is used in the switch-capacitor circuit to facilitate the charge transfer. In an embodiment, each of the cyclic control signals has a period of T. In an alternative embodiment, each of the cyclic control signals has a period of twice of T.

In an embodiment, a frequency synthesizer is disclosed, the frequency synthesizer including: a phase detector that receives a reference clock and a feedback clock and generates a plurality of logical signals to represent a phase difference between the reference clock and the feedback clock; a charge-pump that converts said logical signals into a first current signal; a switch-capacitor loop filter that receives and processes the first current signal and a second current signal to generate a voltage signal; a switch-capacitor clock generator working in accordance with the reference clock for generating a plurality of control signals to control the switch-capacitor loop filter; a variable oscillator that receives the voltage signal and generates an output clock; and a feedback circuit to receive the output clock and provide the feedback clock to the phase detector. The switch-capacitor loop filter is controlled so to work in a multi-phase manner, where there are at least two phases that are non-overlapping. In a first phase, the sampling capacitor integrates the fist current signal and the second current signal. In a second phase, the sampling capacitor transfers charge to the load capacitor. In an embodiment, an amplifier is used in the switch-capacitor loop filter to facilitate the charge transfer.

In an embodiment, a phase locking method is disclosed. The method includes receiving a reference signal and a feedback signal, detecting the phase difference between the reference signal and the feedback signal, representing the detected phase difference with a difference signal, filtering the difference signal using a switch-capacitor circuit, using a output voltage of the switch-capacitor circuit to control a voltage-controlled-oscillator, generating the feedback signal using an output signal of the voltage-controlled-oscillator, generating a timing signal, and controlling switch-capacitor timing with the timing signal. In an embodiment, the reference signal is a reference clock. In an embodiment, the feedback signal is a feedback clock. In an embodiment, representing the detected phase difference includes outputting a logical difference signal and converting the logical difference signal to a current signal. In an embodiment, generating the timing signal includes generating a sampling phase timing signal and a transfer phase timing signal both based on the reference signal. In an embodiment, generating a sampling phase timing signal and a transfer phase timing signal includes generating such that the sampling phase timing signal and the transfer phase timing signal are non-overlapping. In an embodiment, generating a sampling phase timing signal includes centering the sampling phase timing signal essentially on a rising edge of the reference signal. In an embodiment, generating a transfer phase timing signal includes centering the transfer phase timing signal essentially on a falling edge of the reference signal. In an embodiment, generating the timing signal includes generating a reset phase signal that does not overlap the transfer phase signal or the sampling phase signal, and wherein the reset phase signal is to drain residual charge from the switch-capacitor circuit. In an embodiment, controlling switch-capacitor timing includes sampling in steady state around rising edges of reference signal and transferring in steady state around falling edges of reference signal. In an embodiment, generating a timing signal includes generating a plurality of sample signals and generating a plurality of transfer signals, wherein the sample signals are non-overlapping, and wherein the transfer signals are non-overlapping. In an embodiment, generating a plurality of sample signals and generating a plurality of transfer signals provide a time-interleaved sampling scheme. In an embodiment, generating a timing signal includes generating a switch-capacitor enable signal to control the switch-capacitor circuit during a transient phase and a steady-state phase. In an embodiment, generating the feedback signal includes performing fractional-N synthesis with phase noise cancellation before detecting the phase difference.

Devices and systems for providing a phase lock loop are also disclosed. These devices and systems may include a loop filter that has a sampling switch to receive an input signal and a sample control signal; a sampling capacitor operably connected to the sampling switch and a reference voltage; a transfer switch operably connected to the sampling capacitor and to receive a transfer control signal; and a current-to-voltage circuit electrically connected to the transfer switch and to output a voltage signal to control a voltage controlled oscillator. The sampling switch and the transfer switch are not conducting at a same time. The sampling switch and the transfer switch collectively conduct less than a reference signal. In an embodiment, the current-to-voltage circuit includes an inverting amplifier circuit with the output being to the voltage signal. The loop filter may further include a second sampling switch connecting an electrode of the sampling capacitor to ground and a second transfer switch connecting the current-to-voltage circuit to the electrode of the sampling capacitor. The sampling switch and the second sampling switch each receive the sample control signal, wherein the transfer switch and the second transfer switch each receive the transfer control signal, wherein the sample and transfer control signals form a two-phase, non-overlapping clocking scheme, in an embodiment. In an embodiment, the transfer switch includes an output node in common with the current-to-voltage circuit, and wherein a buffer amplifier connects the output node to the second transfer switch. In an embodiment, the current-to-voltage circuit includes a series connected resister and capacitor connected to the output node. The loop filter may further include a second sampling switch to receive the input signal and a second sample control signal, a second sampling capacitor operably connected to the second sampling switch and a reference voltage; a second transfer switch operably connected to the second sampling capacitor and to receive a second transfer control signal, the second transfer switch being connected to the current-to-voltage circuit. The sample switch, second sample switch, transfer switch and second transfer switch provide a time-interleaved sampling scheme. The input signal may be a current signal from a charge pump. The loop filter may further include an operational tans-conductance amplifier connecting the transfer switch to current-to-voltage circuit.

In a further embodiment, the loop filter includes a first sample and transfer circuit to receive an input signal and produce an output signal at an output node, the first sample and transfer circuit including a first sample capacitor, a first enable switch connected between an input and a first electrode of the first sample capacitor, a second enable switch connected between a second electrode of the first sample capacitor and a reference voltage, a first transfer switch connected between the first electrode of the first sample capacitor and the output node, and a second transfer switch connected to the second electrode of the first sample capacitor and in electrical communication with the output node; a second sample and transfer circuit to receive the input signal and produce an output signal at the output node, the second sample and transfer circuit including a second sample capacitor, a third enable switch connected between an input and a first electrode of the second sample capacitor, a fourth enable switch connected between a second electrode of the second sample capacitor and a reference voltage, a third transfer switch connected between the first electrode of the second sample capacitor and the output node, and a fourth transfer switch connected to the second electrode of the second sample capacitor and in electrical communication with the output node; and a current-to-voltage circuit connected to the output node and a reference voltage, the current-to-voltage circuit to provide a voltage signal to a voltage controlled oscillator. The loop filter includes a buffer connecting the output node to the second transfer switch and the fourth transfer switch. In an embodiment, the first sample and transfer circuit and second sample and transfer circuit operate to provide a time interleaved sampling technique. In an embodiment, the first and second sample switches are controlled by a first timing signal. In an embodiment, the first and second transfer switched are controlled by a second timing signal. In an embodiment, the third and fourth sample switches are controlled by a third timing signal. In an embodiment, the third and fourth transfer switches are controlled by a fourth timing signal. The first, second, third, and fourth timing signals are synchronous with a reference signal and define an even cycle sample phase, an even cycle transfer phase, an odd cycle sample phase, and an odd cycle transfer phase, respectively.

A frequency synthesizer is described and includes a phase detector that receives a reference clock and a feedback clock and generates a plurality of logical signals to represent the phase difference between the reference clock and the feedback clock; a charge-pump that converts the logical signals into a first current signal; a switch-capacitor circuit that receives and processes the first current signal and a second current signal to generate an output voltage; a switch-capacitor clock generator working in accordance with the reference clock for generating a plurality of timing signals to control the switch-capacitor circuit; a voltage-controlled-oscillator that receives the output voltage from the switch-capacitor circuit and generates an output clock; and a feedback circuit to receive the output clock and provide a feedback clock to the phase detector. The feedback circuit includes: a multi-modulus divider that divides down the output clock into the feedback clock; a delta-sigma modulator, operated in accordance with the feedback clock, the modulator receiving a fractional number and modulating the fractional number into a sequence of integer values provided to the multi-modulus divider to control a divisor value of the multi-modulus divider; a phase noise estimate circuit for generating an estimate of the phase noise by processing the fractional number and the output of the delta-sigma modulator; and a digital-analog converter to convert phase noise estimate into the second current signal, in various embodiments.

The switch-capacitor circuit includes: a sampling switch to receive an input signal and a sample control signal; a sampling capacitor operably connected to the sampling switch and a reference voltage; and a transfer switch operably connected to the sampling capacitor and to receive a transfer control signal, in an embodiment. The sampling switch and the transfer switch are not conducting at a same time. The sampling switch and the transfer switch collectively conduct less than the reference clock. The switch-capacitor circuit includes an inverting amplifier circuit with the output being to the output voltage signal. The switch-capacitor circuit further includes a second sampling switch connecting an electrode of the sampling capacitor to ground and a second transfer switch connecting the current-to-voltage circuit to the electrode of the sampling capacitor. The sampling switch and the second sampling switch each receive the sample control signal, wherein the transfer switch and the second transfer switch each receive the transfer control signal, wherein the sample and transfer control signals form a two-phase, non-overlapping clocking scheme. The transfer switch includes an output node in common with the current-to-voltage circuit, and wherein a buffer amplifier connects the output node to the second transfer switch. The current-to-voltage circuit includes a series connected resister and capacitor connected to the output node. The switch-capacitor circuit further includes a second sampling switch to receive the input signal and a second sample control signal, a second sampling capacitor operably connected to the second sampling switch and a reference voltage; a second transfer switch operably connected to the second sampling capacitor and to receive a second transfer control signal, the second transfer switch being connected to the current-to-voltage circuit. The sample switch, second sample switch, transfer switch and second transfer switch provide a time-interleaved sampling scheme. The switch-capacitor circuit further comprises an operational tans-conductance amplifier connecting the transfer switch to current-to-voltage circuit, in an embodiment.

In a further embodiment, a fractional-N synthesizer is disclosed. The fractional-N synthesizer includes: a phase/frequency detector (PFD) that receives a reference clock and a feedback clock and generates a plurality of logical signals to represent the phase difference between the two clocks; a charge-pump (CP) circuit that converts said logical signals into a first current signal; a switch-capacitor loop filter (SCLF) that receives and processes the first current signal and a second current signal to generate an output voltage; a switch-capacitor clock generator working in accordance with the reference clock for generating a plurality of timing signals to control the SCLF; a voltage-controlled-oscillator (VCO) that receives the output voltage from the SCLF and generates accordingly an output clock; a multi-modulus divider (MMD) that divides down the output clock into the feedback clock; a delta-sigma modulator, operated in accordance with the feedback clock, the modulator receiving a fractional number and modulating the fractional number into a sequence of integer values provided to the MMD to control the divisor value of the MMD; a phase noise estimate circuit for generating an estimate of the phase noise by processing the fractional number and the output of the delta-sigma modulator; and a digital-analog converter (DAC) to convert phase noise estimate into the second current signal. Both the CP circuit and the DAC circuit have very high output impedance, and therefore both current outputs can be summed by directly connecting their output nodes.

These and other features of the present invention will be readily apparent to persons of ordinary skill in the art upon reading the entirety of this disclosure, which includes the accompanying drawings and claims. This summary is intended to provide an overview of the subject matter of the present patent application. It is not intended to provide an exclusive or exhaustive explanation of the invention. The detailed description is included to provide further information about the subject matter of the present patent application.

DETAILED DESCRIPTION

In the present disclosure, numerous specific details are provided, such as examples of apparatus, circuits, components, and methods, to provide a thorough understanding of embodiments of the invention. Persons of ordinary skill in the art will recognize, however, that the invention can be practiced without one or more of the specific details in various embodiments. In other instances, well-known details are not shown or described to avoid obscuring aspects of the invention.

Figure 1:
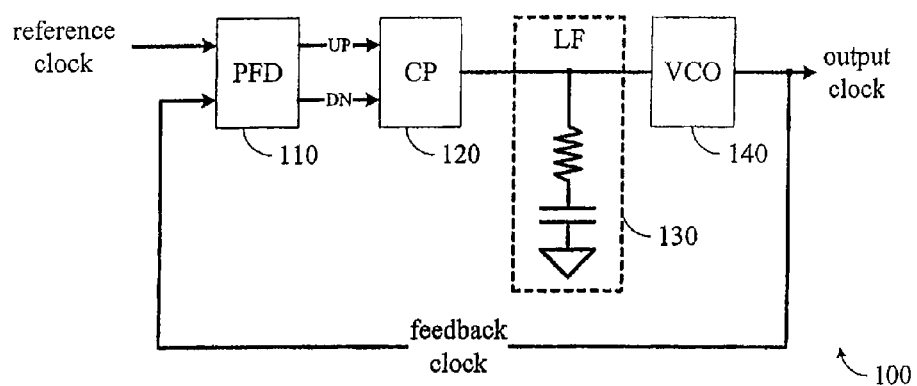
FIG. 1 shows a prior art Phase Lock Loop (PLL) circuit.
Figure 2:
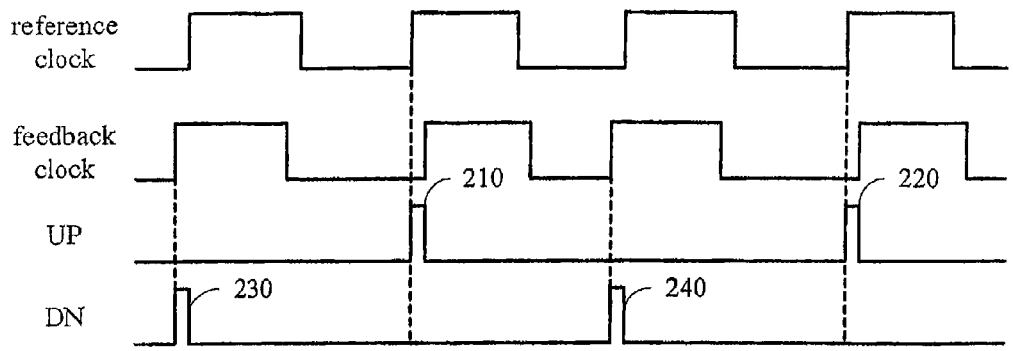
FIG. 2 shows an exemplary timing of a prior art PLL circuit.
Figure 3:
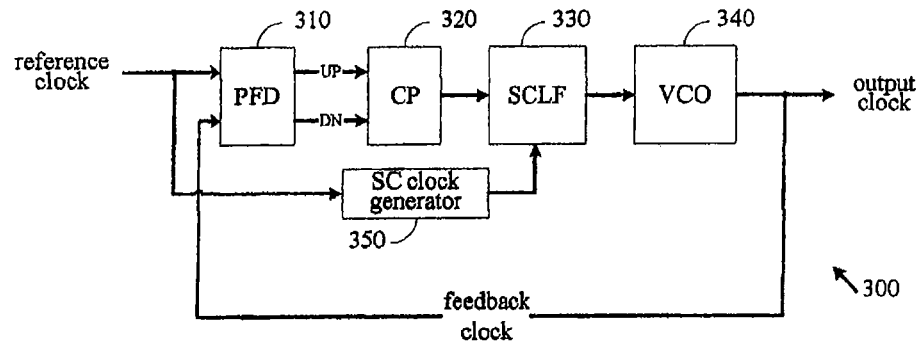
FIG. 3 shows a PLL using a switch-capacitor loop filter (SCLF) according to an embodiment of the invention.

FIG. 3 depicts a functional block diagram of a circuit 300, e.g., a Phase Lock Loop, in accordance with an embodiment of the present invention. In this embodiment, a phase/frequency detector (PFD) 310 compares the phase of an input signal (e.g., a reference clock) with a feedback signal (e.g., a feedback clock). The phase difference between these two signals is represented by an output from the PFD 310. In the illustrated embodiment, the output from PFD 310 includes two logical signals, an UP signal and a DN (down) signal. The UP and DN signals are converted into a current signal by a charge pump (CP) circuit 320. The CP circuit 320 provides the current signal to a switch-capacitor loop filter (SCLF) 330, which converts the current signal into a control voltage to control a variable oscillator embodied by a voltage-controlled oscillator (VCO) 340. The SCLF 330 works in accordance with a plurality of timing signals generated by a switch-capacitor (SC) clock generator 350. The SC clock generator 350 generates the plurality of timing signals based on a timing reference provided by the reference clock. As a result, the control voltage for the variable oscillator, e.g., VCO, is synchronized with the reference clock due to the switch-capacitor circuit, despite that the DN pulses are asynchronous to the reference clock. The aforementioned non-uniform sampling problem is thus reduced.

In accordance with the present invention, there are a number embodiments for implementing the SCLF 330 and the SC clock generator 350.

Figure 4:
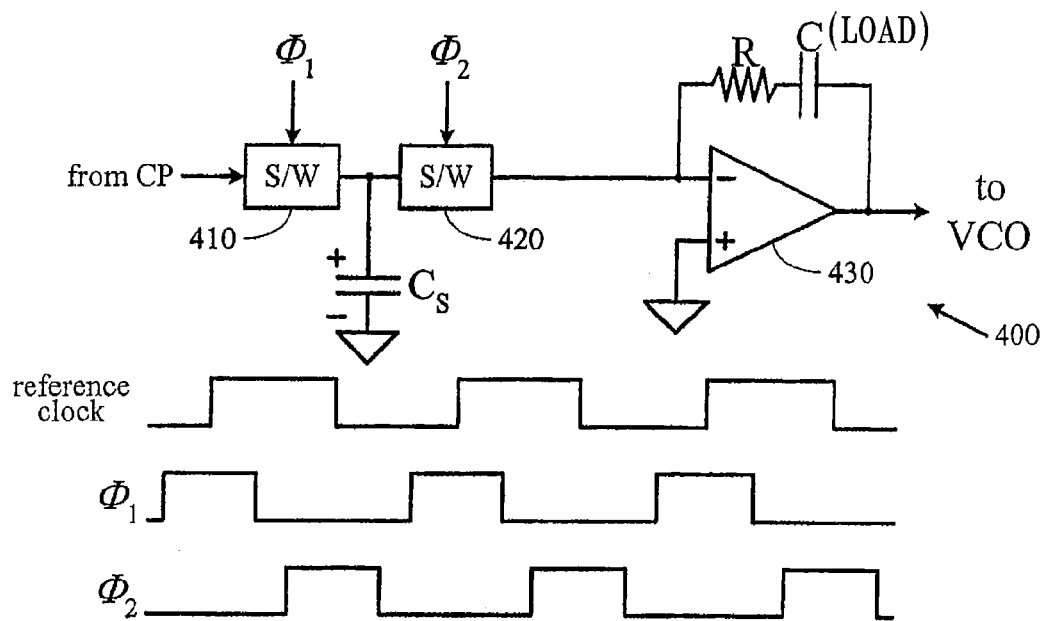
FIG. 4 shows an embodiment of a switch-capacitor loop filter and associated timing.

A first embodiment of the SCLF 330 is illustrated in FIG. 4. In this embodiment, the SCLF includes a first switch 410, a sampling capacitor $C_S$, a second switch 420, and an operational amplifier 430 connected in an inverting amplifier configuration using a feedback circuit that includes a resistor R in series with a capacitor C. Throughout this disclosure, a "ground" symbol in a schematic diagram refers to a circuit node with a fixed DC voltage, which is not necessarily zero. The first switch 410 works in accordance with a first timing signal $\Phi_1$, while the second switch 420 works in accordance with a second timing signal $\Phi_2$. The two timing signals $\Phi_1$ and $\Phi_2$ form a two-phase non-overlapping clocking scheme in accordance with the reference clock. The first timing signal $\Phi_1$ defines a "sampling phase," while the second timing signal $\Phi_2$ defines a "transfer phase." During the sampling phase: $\Phi_1$ is high; $\Phi_2$ is low; the switch 410 is turned on; the switch 420 is turned off; and the current signal from the CP is connected to and integrated by the sampling capacitor $C_S$. During the transfer phase: $\Phi_1$ is low; $\Phi_2$ is high; the switch 410 is turned off; the switch 420 is turned on; and the charge stored by the sampling capacitor $C_S$ is transferred to the active loop filter formed by the inverting amplifier constructed by the operational amplifier 430 and the feedback circuit of R and C. As shown in the timing diagram shown in FIG. 4, the first timing signal $\Phi_1$ consists of pulses centered essentially around the rising edges of the reference clock with a pulse width less than, e.g., slightly smaller, than half of the reference clock cycle. This defines a suitable sampling phase since in steady state the UP/DN pulses mostly occur around the rising edges of the reference clock. The second timing signal $\Phi_2$ consists of pulses centered on the falling edges of the reference clock with a pulse width less than, e.g., slightly smaller, than half of the reference clock cycle. This defines a suitable transfer phase since in steady state there are almost no UP/DN pulses around the falling edges of the reference clock. The switch-capacitor circuit in accordance with this embodiment needs to settle, i.e., reach an essentially steady value, within about half of the reference clock cycle.

Additional circuit elements can be added to improve the performance of the loop filter. For example, an additional capacitor shunt with the R-C circuit can be included in the feedback path. Also, a second series R-C circuit can be added between the operational amplifier output and the ground. In this particular case, the voltage at the node between the resistor and the capacitor of the second series R-C circuit will be used as the control voltage for the VCO.

Figure 5:
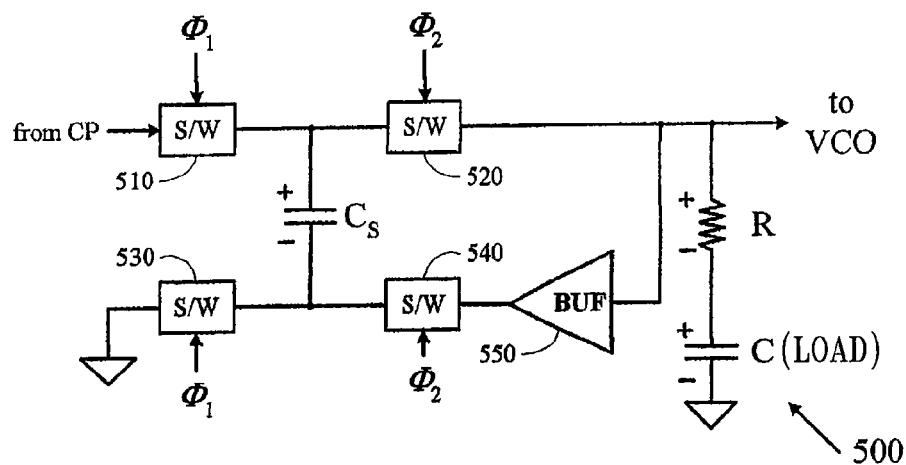
FIG. 5 shows an embodiment of a switch-capacitor loop filter.

A second embodiment of the SCLF 330 is illustrated in FIG. 5. In this embodiment, the SCLF 500 includes a sampling capacitor $C_S$, four switches 510, 520, 530, and 540, a loop filter including a resistor R in series with a capacitor C, and a buffer amplifier 550. The buffer amplifier has very high input impedance and very low output impedance, and its output voltage follows its input voltage. A buffer amplifier can be implemented, for instance, using an operational amplifier having a "+" input terminal, a "−" input terminal, and an output end, where the "+" input terminal, is connected to the input of the buffer and the output end is connected to the "−" input terminal, and also to the output load of the buffer. The two switches 510 and 530 work in accordance with a first timing signal $\Phi_1$. The other two switches 520 and 540 work in accordance with a second timing signal clock $\Phi_2$. The two signals $\Phi_1$ and $\Phi_2$ form a two-phase non-overlapping clocking scheme in accordance with the reference clock, in a manner that is the same as that in the first embodiment illustrated by the timing diagram shown in FIG. 4. During the sampling phase: $\Phi_1$ is high; $\Phi_2$ is low; switches 510 and 530 are turned on; switches 520 and 540 are turned off. Accordingly, the current output from the charge pump (CP) is connected to and integrated by the sampling capacitor $C_S$. During the transfer phase: $\Phi_1$ is low; $\Phi_2$ is high; switches 510 and 530 are turned off; switches 520 and 540 are turned on. Accordingly, the positive end of the sampling capacitor $C_S$ is connected to the positive end of the resistor R; the negative end of the sampling capacitor $C_S$ is connected to the output of the buffer amplifier, whose input is connected to the positive end of the resistor R. As a result, the charge stored on the sampling capacitor $C_S$ is transferred to the capacitor C via the resistor R. The switch-capacitor circuit in accordance with this embodiment needs to settle within roughly half of the reference clock cycle.

Additional circuit elements can be added to improve the performance of the loop filter of this embodiment. For example, an additional capacitor or a plurality of capacitors can be added between the positive end of the resistor and the ground. Also, a second series R-C circuit can be added between the positive end of the resistor R and the ground. In this particular case, the voltage at the node between the capacitor and the resistor of the second series R-C circuit will be used as the control voltage for the VCO.

Still referring to FIG. 5, an alternative embodiment can be shown by removing switches 530 and 540 and connecting the negative end of the capacitor $C_S$ directly to the output of the buffer 550 without changing the clocking scheme.

Still referring to FIG. 5, a problem known as "charge injection" may be associated with a general switch capacitor circuit. Various techniques to alleviate the "charge injection" problem by properly manipulating the clocking scheme of a switch-capacitor circuit of interest may be used with the embodiments described herein. For example, two new clocks, say $\Phi_{1N}$ and $\Phi_{2N}$, may be introduced to replace $\Phi_1$ and $\Phi_2$, respectively, for controlling the switches 530 and 540, respectively. These two new clocks are slightly modified from $\Phi_1$ and $\Phi_2$, respectively, to alleviate charge injection. The rising edge of the clock $\Phi_{1N}$ slightly leads the rising edge of the clock $\Phi_1$, and the falling edge of the clock $\Phi_{1N}$ slightly trails the falling edge of the clock $\Phi_1$. Similarly, the rising edge of the clock $\Phi_{2N}$ slightly leads the rising edge of the clock $\Phi_2$, and the falling edge of the clock $\Phi_{2N}$ slightly trails the falling edge of the clock $\Phi_2$. The doctrine of "non-overlapping clocking" is still satisfied between $\Phi_{1N}$ and $\Phi_{2N}$. That is, the width of the new clock signals $\Phi_{1N}$ and $\Phi_{2N}$ is greater than the width of the clock signals $\Phi_1$ and $\Phi_2$, respectively. In an embodiment, the width of the new clock signals $\Phi_{1N}$ and $\Phi_{2N}$ are each less than but comparable to half the cycle of the reference clock. In an example, this width is greater than 40% the cycle of the reference clock. In an example, this width is greater than 45% the cycle of the reference clock. The generation of these new clock signals to meet the timing relation is well known by people of ordinary skill in the art and thus is not described in detail here.

An optional third clock phase, referred to as "reset phase," which is defined by a third timing signal $\Phi_3$ and is not overlapping with either the "sampling phase" or the "transfer phase" can be implemented in both the first embodiment illustrated in FIG. 4 and the second embodiment illustrated in FIG. 5. The "reset phase" is to reset the residual charge stored on the sampling capacitor $C_S$ in case the charge transfer is incomplete, i.e., the charge in sampling capacitor is not completely discharged in the transfer phase. For the first embodiment shown in FIG. 4, the optional reset circuit (not shown in the figure) uses an additional switch, working in accordance with the third timing signal $\Phi_3$, to connect the positive end of the sampling capacitor $C_S$ to its negative end during the reset phase. For the second embodiment shown in FIG. 5, the optional reset circuit (not shown in the figure) uses an additional switch, working in accordance with the third timing signal $\Phi_3$, to connect both the positive end and the negative end of the sampling capacitor $C_S$, i.e., short the capacitor, during the reset phase.

For both the first embodiment as illustrated in FIG. 4 and the second embodiment as illustrated in FIG. 5, the switch-capacitor circuit needs to settle within roughly half of the reference clock cycle. If somehow the timing requirement is too difficult to meet, we may employ a "time-interleaved" sampling scheme to relax the timing requirement by a factor of roughly two. In a "time-interleaved" sampling scheme, we regard the reference clock as alternating between "even cycle" and "odd cycle" and treat them separately.

Figure 6:
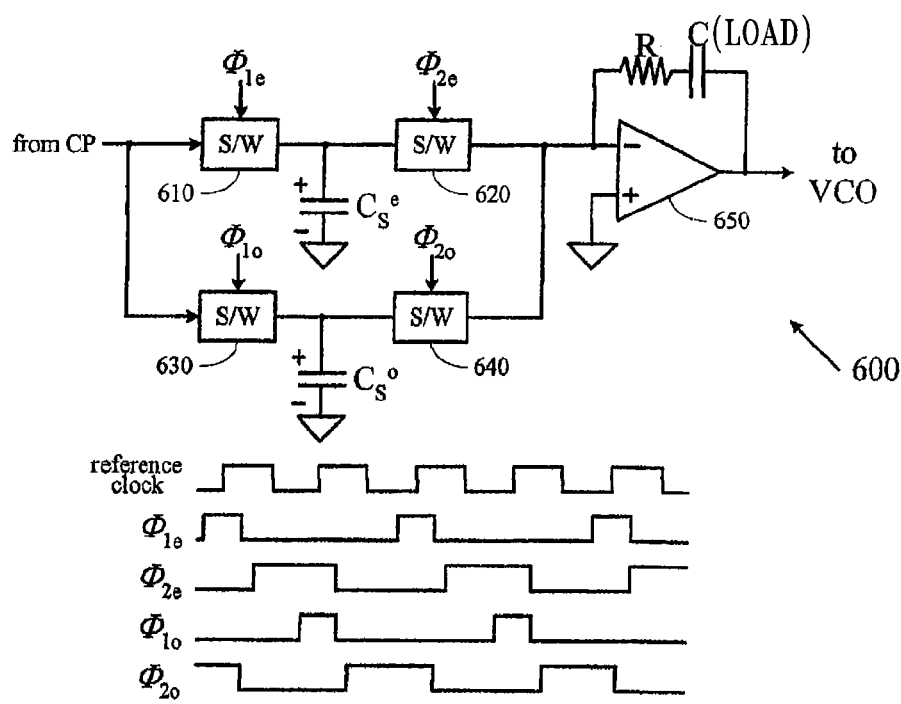
FIG. 6 shows an embodiment of a switch-capacitor loop filter using time-interleaved sampling.

FIG. 6 illustrates an alternative embodiment that applies "time-interleaved" sampling technique to the first embodiment illustrated in FIG. 4. In this alternative embodiment, the SCLF 600 includes four switches 610, 620, 630, and 640, two sampling capacitors $C_S^e$ and $C_S^o$, and an operational amplifier 650 connected in an inverting amplifier configuration using a feedback circuit that includes a resistor R in series with a capacitor C. The first switch 610 works in accordance with a first timing signal $\Phi_{1e}$. The second switch 620 works in accordance with a second timing signal $\Phi_{2e}$. The third switch 630 works in accordance with a third timing signal $\Phi_{1o}$. The fourth switch 640 works in accordance with a third timing signal $\Phi_{2o}$. All these four timing signals are synchronous with the reference clock. These four timing signals $\Phi_{1e}$, $\Phi_{2e}$, $\Phi_{1o}$, and $\Phi_{2o}$ define the four phases of an interleaved sampling-and-transfer scheme: even cycle sampling, even cycle transfer, odd cycle sampling, and odd cycle transfer, respectively. During the even cycle sampling phase, the current from the CP is connected to and integrated by the sampling capacitor $C_S^e$. During the even cycle transfer phase, the charge stored on the sampling capacitor $C_S^e$ is transferred to the active loop filter that includes the operational amplifier 650 with the series R-C feedback circuit. During the odd cycle sampling phase, the current from the CP is connected to and integrated by the sampling capacitor $C_S^o$. During the odd cycle transfer phase, the charge stored on the sampling capacitor $C_S^o$ is transferred to the active loop filter that includes the operational amplifier 650 with the series R-C feedback circuit. There is no overlapping between "even cycle sampling" and "even cycle transfer," or between "odd cycle sampling" and "odd cycle transfer," or between "even cycle sampling" and "odd cycle sampling," or between "even cycle transfer" and "odd cycle transfer." An exemplary timing diagram of the four phase clocking is shown in FIG. 6.

Figure 7:
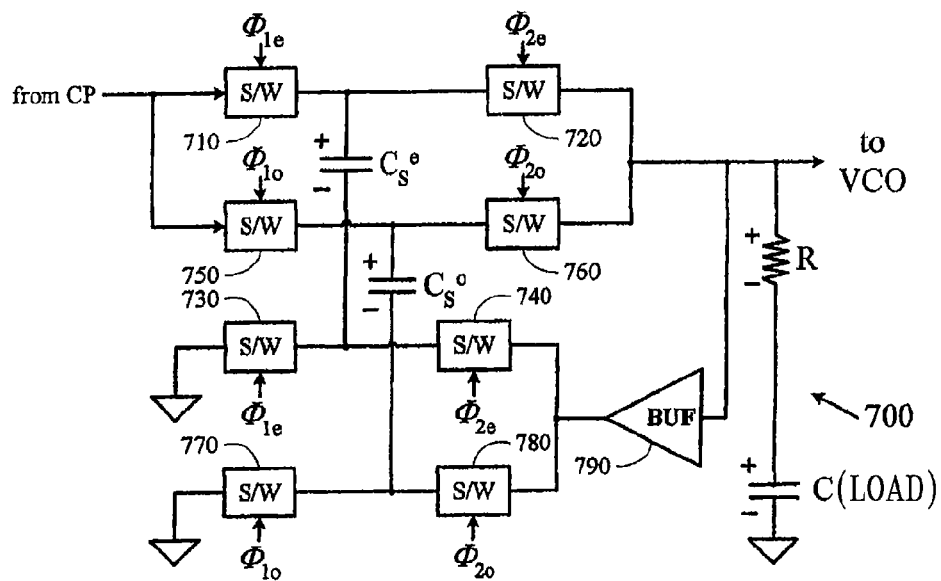
FIG. 7 shows an embodiment of a switch-capacitor loop filter using time-interleaved sampling.

A similar technique can be applied to the embodiment illustrated in FIG. 5. FIG. 7 illustrates alternative embodiment that applies "time-interleaved" sampling technique to the embodiment illustrated in FIG. 5. In the FIG. 7 embodiment, the SCLF 700 includes eight switches 710, 720, 730, 740, 750, 760, 770, and 780, two sampling capacitors $C_S^e$ and $C_S^o$, a buffer amplifier 790, and a loop filter that includes a series R-C circuit. Switches 710 and 730 work in accordance with a first timing signal $\Phi_{1e}$. Switches 720 and 740 work in accordance with a second timing signal $\Phi_{2e}$. Switches 750 and 770 work in accordance with a third timing signal $\Phi_{1o}$. Switches 760 and 780 work in accordance with a fourth timing signal $\Phi_{2o}$. All these four timing signals are synchronous with the reference clock. These four clocks $\Phi_{1e}$, $\Phi_{2e}$, $\Phi_{1o}$, and $\Phi_{2o}$ define the four phases of an interleaved sampling-and-transfer scheme: even cycle sampling, even cycle transfer, odd cycle sampling, and odd cycle transfer, respectively. During even cycle sampling phase, the current from the CP is connected to and integrated by the first sampling capacitor $C_S^e$. During even cycle transfer phase, the charge stored on the first sampling capacitor $C_S^e$ is transferred to the capacitor C via the resistor R. During odd cycle sampling phase, the current from the CP is connected to and integrated by the second sampling capacitor $C_S^o$. During odd cycle transfer phase, the charge stored on the second sampling capacitor $C_S^o$ is transferred to the capacitor C via the resistor R. There is no overlapping between "even cycle sampling" and "even cycle transfer," or between "odd cycle sampling" and "odd cycle transfer," or between "even cycle sampling" and "odd cycle sampling," or between "even cycle transfer" and "odd cycle transfer." The exemplary timing diagram of the four phase clocking shown in FIG. 6 can be applied to this embodiment.

Those of ordinary skill in the art may want to slightly modify the clocking scheme to alleviate the aforementioned "charge injection" problem in a manner similar to that described above. For example, one may introduce four new clock phases $\Phi_{1eN}$, $\Phi_{1oN}$, $\Phi_{2eN}$, and $\Phi_{2oN}$, to replace $\Phi_{1e}$, $\Phi_{1o}$, $\Phi_{2e}$, and $\Phi_{2o}$, respectively, for controlling switches 730, 770, 740, and 780, respectively. The rising edge of the clock $\Phi_{1eN}$ slightly leads the rising edge of the clock $\Phi_{1e}$, and the falling edge of the clock $\Phi_{1eN}$ slightly trails the falling edge of the clock $\Phi_{1e}$. Similar timing relationship applies to $\Phi_{1oN}$ and $\Phi_{1o}$, $\Phi_{2eN}$ and $\Phi_{2e}$, $\Phi_{2oN}$ and $\Phi_{2o}$.

Figure 8:
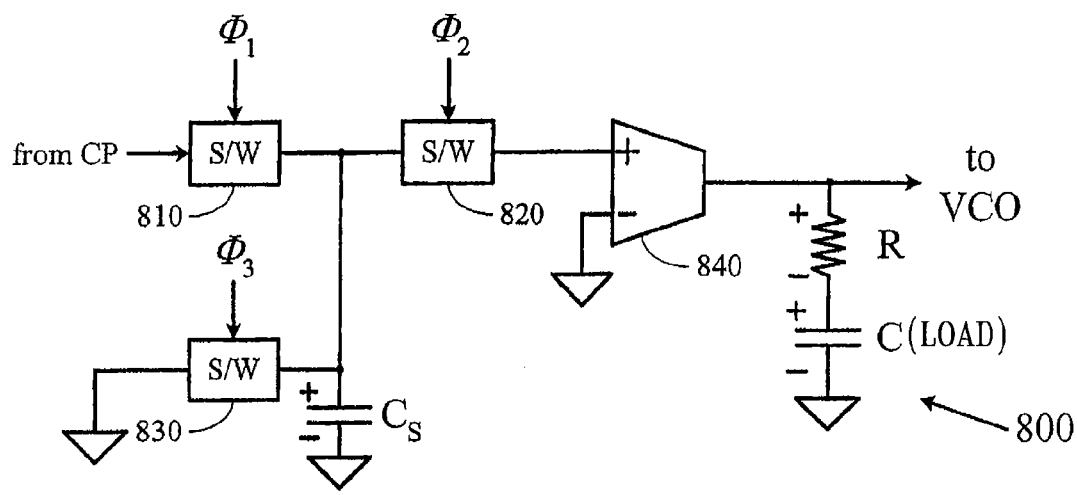
FIG. 8 shows an embodiment of a switch-capacitor loop filter.

A third embodiment of the SCLF 330 is illustrated in FIG. 8. In this embodiment, the SCLF 800 includes three switches 810, 820, and 830, a sampling capacitor $C_S$, an operational trans-conductance amplifier (OTA) 840, and a resistor R in series connection with a capacitor C. The OTA 840, which converts its input voltage into an output current, has very high input impedance and very high output impedance. The first switch 810 works in accordance with a first timing signal $\Phi_1$. The second switch 820 works in accordance with a second timing signal $\Phi_2$. The third switch 830 works in accordance with a third timing signal $\Phi_3$. The three signals $\Phi_1$, $\Phi_2$, and $\Phi_3$ form a three-phase non-overlapping clocking scheme in accordance with the reference clock, in a manner that is similar to that in the first embodiment with the optional "reset phase" described above. The first timing signal $\Phi_1$ defines a "sampling phase." The second timing signal $\Phi_2$ defines a "transfer phase." The third timing signal $\Phi_3$ defines a "reset phase." Both the negative end of $C_S$ and the inverting input end of the OTA 840 are grounded as shown in FIG. 8. In a further embodiment, the negative end of $C_S$ and the inverting input end of the OTA 840 are connected to a fixed DC voltage. During the sampling phase: $\Phi_1$ is high; $\Phi_2$ is low; $\Phi_3$ is low; switch 810 is turned on; switch 820 is turned off; switch 830 is turned off; and the current signal from the CP is connected to and integrated by the sampling capacitor $C_S$. During the transfer phase: $\Phi_1$ is low; $\Phi_2$ is high; $\Phi_3$ is low; switch 810 is turned off; switch 820 is turned on; switch 830 is turned off; and OTA 840 converts the voltage across the sampling capacitor $C_S$ into a current and delivers the current to the filter that includes the series R-C circuit. During the "reset phase," $\Phi_1$ is low; $\Phi_2$ is low; $\Phi_3$ is high; switch 810 is turned off; switch 820 is turned off; switch 830 is turned on; and the charge stored on the sampling capacitor $C_S$ is discharged, for example to ground or a negative voltage.

In a further embodiment, an optional fourth switch (not shown in the figure) working in accordance with the timing signal $\Phi_2$ can be inserted between the output of the OTA 840 and the positive end of the resistor R. This will prevent charge leakage of the capacitor C when the SCLF 800 is not in the transfer phase.

Still referring to FIG. 8, additional circuit elements can be added to improve the performance of the loop filter. For example, an additional capacitor shunt with the R-C circuit can be included in the feedback path. Also, a second series R-C circuit can be added between the output of the OTA 840 and the ground. In this particular case, the voltage at the node between the capacitor and the resistor of the second series R-C circuit will be used as the control voltage for the VCO.

Aforementioned embodiments of switch-capacitor loop filters all have a sampling phase that is centered at the rising edge of the reference clock. This is because in steady state the current pulses are always generated around the rising edge of the reference clock. However, it always takes some time for the PLL to settle to the steady state. According to a further embodiment of the present invention, the aforementioned multi-phase switch-capacitor loop filter is enabled only during the steady state. During transient state, the switch-capacitor circuit is bypassed and the CP current is directly passed to the loop filter. For example, for the first embodiment illustrated in FIG. 4, we may force the two-phase timing signals $\Phi_{1e}$ and $\Phi_{2e}$ to be high during the transient state. In doing so, we effectively bypass the sampling capacitor $C_S$ and make it irrelevant (because it is tied to a virtual ground due to the negative feedback of the operational amplifier 430) and directly pass the charge pump current to the active filter that includes the operational amplifier 430 connected in an inverting amplifier configuration using a feedback circuit that includes a resistor R in series with a capacitor C. Similar techniques can be used for all of aforementioned embodiments.

Figure 9:
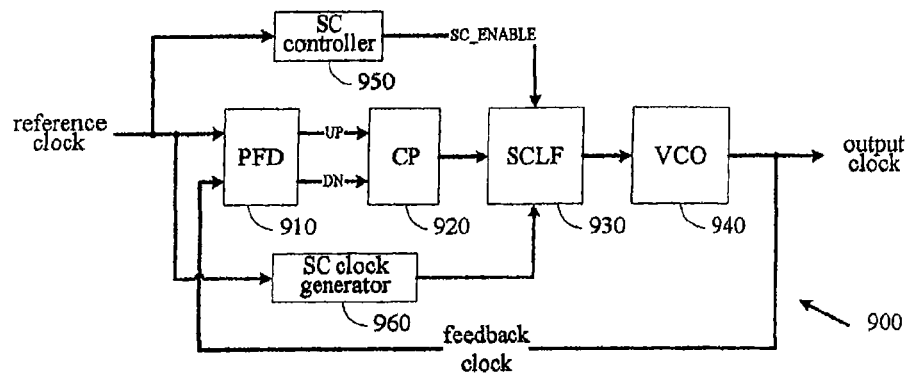
FIG. 9 shows a further embodiment of a phase lock loop that employs a controller to enable the switch-capacitor function only when the PLL reaches steady state.

In a further embodiment, a SC controller is used to generate a SC_ENABLE signal that enables the switch-capacitor circuit, as illustrated in FIG. 9. The SC controller 950 receives the reference clock and generates the SC_ENABLE signal based on the reference clock. During transient state, SC_ENABLE is set low thus disabling the switch-capacitor function of the SCLF block and directly passing the CP current into the loop filter within the SCLF block. During steady state, SC_ENABLE is set high thus enabling the normal switch-capacitor function of the SCLF block. In an embodiment, the SC_ENABLE is initially set low for a pre-determined period of time and then set high afterward. In an embodiment, a properly reset counter is used and the SC_ENABLE is set low until the counter output reaches a pre-determined value after reset.

Figure 10:
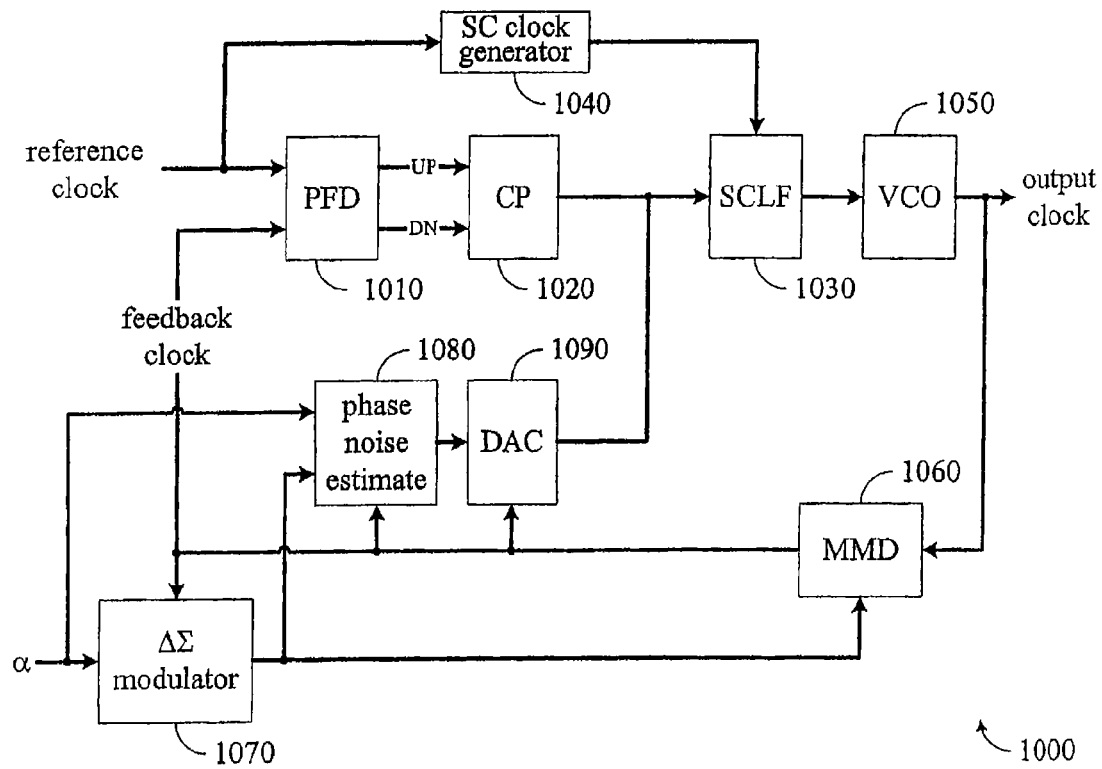
FIG. 10 shows an embodiment of a phase lock loop employing SCLF in a fractional-N synthesizer with phase noise cancellation.

In a further embodiment, a switch-capacitor loop filter is applied to a fractional-N synthesizer with phase noise cancellation, as illustrated in FIG. 10. The fractional-N synthesizer 1000 includes a phase/frequency detector (PFD) 1010 that receives a reference clock and a feedback clock and generates logic signals, for example, UP and DN, to represent the phase difference between the two clocks. A charge-pump (CP) circuit 1020 converts the logic signals into a first current signal. A switch-capacitor loop filter (SCLF) 1030 receives and processes the first current signal and a second current signal to generate an output voltage. An SC clock generator 1040 works in accordance with the reference clock for generating a plurality of timing signals to control the SCLF 1030. A voltage-controlled-oscillator (VCO) 1050 receives the output voltage from the SCLF 1030 and generates an output clock based on the received voltage. A multi-modulus divider (MMD) 1060 receives the output clock and divides down the output clock into the feedback clock. A delta-sigma modulator 1070 operates in accordance with the feedback clock. The modulator 1070 receives a fractional number α and modulates the fractional number into a sequence of integer values provided to the MMD 1060 to control the divisor value of the MMD 1060. A phase noise estimate circuit 1080 generates an estimate of the phase noise by processing the fractional number and the output of the delta-sigma modulator 1070. A digital-analog converter (DAC) 1090 working in accordance with the feedback clock converts the phase noise estimate into the second current signal. Both the CP circuit 1020 and the DAC circuit 1090 have very high output impedance. As a result, both current outputs can be summed by directly connecting their output nodes. The methods for performing the delta-sigma modulation and estimating the phase noise are well known in art and thus not described here. For example, they are described in detail in the article titled "A wideband 2.4-GHz delta-sigma fractional-N PLL with 1-Mb/s in-loop modulator" written by Pamarti et al and published in the January, 2004 issue of the IEEE Journal of Solid-State Circuits, which is hereby incorporated by reference for any purpose. The SCLF 1030 can be implemented based on any embodiment described above.

Still referring to FIG. 10, the DAC 1090 needs to operate in a pulse mode, where the output current is turned on only during the sampling phase of the SCLF. In steady state, the feedback clock is tracking well with the reference clock, so even though DAC 1090 works in accordance with the feedback clock, the timing requirement can be met. In a further embodiment, a counter is used to indicate the PLL is in steady state. In a further embodiment, the switch-capacitor function of the SCLF 1030 is turned on only during steady state. In a further embodiment, the phase noise estimate circuit 1080 and the DAC 1090 are enabled only during steady state.

The present description labels certain elements as switches, which operate to electrically connect and disconnect electrical components. One embodiment of these switches includes transistors. Such transistors will have operational speeds, i.e., switching speed, that are within the operational parameters of the circuit. Such transistors may further be part of a switching circuit that includes other components.

It is to be understood that the above description is intended to be illustrative, and not restrictive. For example, the above-described embodiments (and/or aspects thereof) may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

The invention claimed is:

1. A phase locking method, the method comprising:
receiving a reference signal and a feedback signal;
detecting a phase difference between the reference signal and the feedback signal;
representing the phase difference with a current signal;
processing the current signal using a switch-capacitor circuit comprising a sampling capacitor, a load capacitor, and a plurality of switches;
using an output of the switch-capacitor circuit to control a variable oscillator;
generating the feedback signal using an output of the variable oscillator;
generating a plurality of timing signals based on a timing of the reference signal including generating a first timing signal and a second timing signal for defining a sampling phase and a charge-transfer phase, respectively, wherein the sampling phase is centered approximately at a first edge of the reference signal;
controlling said switches using said timing signals including turning on a sampling switch and turning off a charge-transfer switch during a sampling phase to allow the sampling capacitor to integrate the current signal, and turning off the sampling switch and turning on the charge-transfer switch during a charge-transfer phase to allow the charge stored on the sampling capacitor to transfer to the load capacitor; and
using an amplifier to facilitate the charge transfer during the charge-transfer phase.

2. The method of claim 1, wherein detecting a phase difference further comprises generating a plurality of logical signals to represent the phase difference.

3. The method of claim 1, wherein the sampling phase and the charge-transfer phase are non-overlapping.

4. The method of claim 1, wherein the charge-transfer phase is centered approximately at a second edge of the reference signal.

5. The method of claim 4, wherein the sampling phase is centered approximately at a rising edge of a pulse of the reference signal and the charge-transfer phase is centered approximately at a falling edge of the pulse.

6. The method of claim 1, wherein the amplifier is an operational amplifier connected in a negative feedback configuration.

7. The method of claim 1, wherein the amplifier facilitates the charge transfer by forcing a charge transfer to make the charge stored on the sampling capacitor approach zero.

8. The method of claim 1, wherein generating a plurality of timing signal includes generating a first group of timing signals and a second group of timing signals, wherein any two timing signals from the same group have similar timings but any two timing signals from different groups have very different timings.

9. The method of claim 1, wherein generating a plurality of timing signals includes generating a logical signal set to a first value to disable the switch-capacitor circuit function during an initialization period and set to a second value to enable the switch-capacitor circuit function.

10. The method of claim 1, wherein the variable oscillator is a voltage-controlled oscillator.

11. The method of claim 10, wherein generating the feedback signal further comprises dividing down an output of the variable oscillator using a divider.

12. The method of claim 11, wherein the divider is a multi-modulus divider.

13. A phase locking method, the method comprising:
receiving a reference signal and a feedback signal;
detecting a phase difference between the reference signal and the feedback signal;
representing the phase difference with a current signal;
processing the current signal using a switch-capacitor circuit comprising a sampling capacitor, a load capacitor, and a plurality of switches;
using an output of the switch-capacitor circuit to control a variable oscillator;
generating the feedback signal using an output of the variable oscillator;
generating a plurality of timing signals based on a timing of the reference signal including generating a first timing signal and a second timing signal for defining a sampling phase and a charge-transfer phase, respectively, wherein the sampling phase is centered approximately at a first edge of the reference signal; and
controlling said switches using said timing signals, wherein generating a plurality of timing signals further includes generating a third timing signal defining a reset phase for clearing off residual charge on the sampling capacitor, wherein the reset phase does not overlap the charge-transfer phase or the sampling phase.

14. A phase locking method, the method comprising:
receiving a reference signal and a feedback signal;
detecting a phase difference between the reference signal and the feedback signal;
representing the phase difference with a current signal;
processing the current signal using a switch-capacitor circuit comprising a sampling capacitor, a load capacitor, and a plurality of switches;
using an output of the switch-capacitor circuit to control a variable oscillator;
generating the feedback signal using an output of the variable oscillator;
generating a plurality of timing signals based on a timing of the reference signal including generating a first timing signal and a second timing signal for defining a sampling phase and a charge-transfer phase, respectively, wherein the sampling phase is centered approximately at a first edge of the reference signal; and
controlling said switches using said timing signals, wherein generating a plurality of timing signal includes generating a first timing signal, a second timing signal, a third timing signal, and a fourth timing signal, wherein: the first timing signal does not overlap the second timing signal, the first timing signal does not overlap the third timing signal, the second timing signal does not overlap the fourth timing signal, and the third timing signal does not overlap the fourth timing signal.

15. The method of claim 14, wherein the method includes processing the current signal using an additional sampling capacitor.

16. A phase locking method, the method comprising:
receiving a reference signal and a feedback signal;
detecting a phase difference between the reference signal and the feedback signal;
representing the phase difference with a current signal;
processing the current signal using a switch-capacitor circuit comprising a sampling capacitor, a load capacitor, and a plurality of switches;
using an output of the switch-capacitor circuit to control a variable oscillator;
generating the feedback signal using an output of the variable oscillator;
generating a plurality of timing signals based on a timing of the reference signal including a first timing signal, a second timing signal, a third timing signal, and a fourth timing signal that are different from each other, wherein: the reference signal is a clock signal alternating between an even cycle and an odd cycle; the first timing signal is centered approximately at an edge of the even cycle of the reference signal; and the third timing signal is centered approximately at an edge of the odd cycle of the reference signal; and
controlling said switches using said timing signals.

17. The method of claim 16, wherein generating the feedback signal further comprises fractionally dividing down an output of the variable oscillator using a divider.

18. The method of claim 17, wherein the divider is a multi-modulus divider.

19. A phase lock loop (PLL) comprising:
a phase detector for receiving a reference clock having a period T and a feedback clock and for generating a plurality of logical signals to represent a phase difference between the reference clock and the feedback clock;
a charge pump for converting said logical signals into a current signal;
a switch-capacitor circuit comprising a first sampling capacitor, a load capacitor, and a plurality of switches controlled by a plurality of cyclic control signals, respectively, for converting the current signal into a voltage signal, wherein said cyclic control signals comprise a first control signal having a first timing and a second control signal having a second timing wherein the first timing is centered approximately at a first edge of the reference clock and the second timing is centered approximately at a second edge of the reference clock;
an amplifier to facilitate the charge transfer during a charge-transfer phase corresponding to the second timing;
a variable oscillator controlled by the voltage signal for generating an output clock and the feedback clock; and
a control generator for generating said cyclic control signals based on a timing defined by the reference clock.

20. The PLL of claim 19, wherein each of said cyclic control signals has the same period T.

21. The PLL of claim 20, wherein each of said cyclic control signals has a duty cycle comparable to 50%.

22. The PLL of claim 20, wherein the second timing does not overlap with the first timing.

23. The PLL of claim 19, wherein said cyclic control signals comprise a first control signal having a first timing, a second control signal having a second timing, a third control signal having a third timing, and a fourth control signal having a fourth timing.

24. The PLL of claim 19, wherein the second timing does not overlap with the first timing.

25. The PLL of claim 24, wherein upon the first timing the sampling capacitor integrates the current signal via a first switch that is turned on by the first control signal, and upon the second timing the sampling capacitor transfers charge to the load capacitor via a second switch turned on by the second control signal.

26. The PLL of claim 25, wherein the amplifier includes an operational amplifier connected in a negative feedback configuration to facilitate the charge transfer from the sampling capacitor to the load capacitor upon the second timing.

27. A phase lock loop (PLL) comprising:
a phase detector for receiving a reference clock having a period T and a feedback clock and for generating a plurality of logical signals to represent a phase difference between the reference clock and the feedback clock;
a charge pump for converting said logical signals into a current signal;
a switch-capacitor circuit comprising a first sampling capacitor, a load capacitor, and a plurality of switches controlled by a plurality of cyclic control signals, respectively, for converting the current signal into a voltage signal, wherein said cyclic control signals comprise a first control signal having a first timing and a second control signal having a second timing wherein the first timing is centered approximately at a first edge of the reference clock and the second timing is centered approximately at a second edge of the reference clock;
a variable oscillator controlled by the voltage signal for generating an output clock and the feedback clock; and
a control generator for generating said cyclic control signals based on a timing defined by the reference clock, wherein said cyclic control signals comprise a first control signal having a first timing, a second control signal having a second timing, a third control signal having a third timing, and a fourth control signal having a fourth timing, wherein the first timing does not overlap the second timing, the first timing does not overlap the third timing, the second timing does not overlap the fourth timing, and the third timing does not overlap the fourth timing.

28. A phase lock loop (PLL) comprising:
a phase detector for receiving a reference clock having a period T and a feedback clock and for generating a plurality of logical signals to represent a phase difference between the reference clock and the feedback clock;
a charge pump for converting said logical signals into a current signal;
a switch-capacitor circuit comprising a first sampling capacitor, a load capacitor, and a plurality of switches controlled by a plurality of cyclic control signals, respectively, for converting the current signal into a voltage signal, wherein said cyclic control signals comprise a first control signal having a first timing, a second control signal having a second timing, a third control signal having a third timing, and a fourth control signal having a fourth control signal and wherein: the reference clock is alternating between an even cycle and an odd cycle, the first timing is centered approximately at a first edge of the even cycle, and the third timing is centered approximately at a first edge of the odd cycle; the first control signal, the second control signal, the third control signal, and the fourth control signal being different from each other;
a variable oscillator controlled by the voltage signal for generating an output clock and the feedback clock; and
a control generator for generating said cyclic control signals based on a timing defined by the reference clock.

29. The PLL of claim 28, wherein both the first timing and the third timing have a period of twice of T and a duty cycle comparable to 25%.

30. The PLL of claim 28, wherein both the second timing and the fourth timing have a period of twice of T and a duty cycle comparable to 50%.

31. The PLL of claim 28, wherein the first timing does not overlap the second timing, the first timing does not overlap the third timing, the second timing does not overlap the fourth timing, and the third timing does not overlap the fourth timing.

32. A frequency synthesizer comprising:
a phase detector that receives a reference clock and a feedback clock and generates a plurality of logical signals to represent a phase difference between the reference clock and the feedback clock;
a charge-pump that converts said logical signals into a first current signal;
a switch-capacitor loop filter that receives and processes the first current signal and a second current signal to generate a voltage signal;
a switch-capacitor clock generator working in accordance with the reference clock for generating a plurality of control signals to control the switch-capacitor loop filter, wherein the switch-capacitor loop filter includes:
a first switch controlled by a first control signal having a first timing wherein the first timing is centered approximately at a first edge of the reference clock,
a second switch controlled by a second control signal having a second timing,
a sampling capacitor,
a load capacitor; and
an amplifier to facilitate a charge transfer correlated to the second timing;
a variable oscillator that receives the voltage signal and generates an output clock; and
a feedback circuit to receive the output clock and provide the feedback clock to the phase detector.

33. The frequency synthesizer of claim 32, wherein the feedback circuit includes:
a multi-modulus divider that divides down the output clock into the feedback clock;
a delta-sigma modulator, operated in accordance with the feedback clock, the modulator receiving a fractional number and modulating the fractional number into a sequence of integer numbers sequentially used to control a divisor value of the multi-modulus divider;
a phase noise estimate circuit for generating an estimate of a phase noise due to using the sequence of integer numbers in lieu of the fractional number for the divisor value; and
a digital-analog converter to convert phase noise estimate into the second current signal.

34. The frequency synthesizer of claim 32, wherein the first timing does not overlap the second timing.

35. The frequency synthesizer of claim 34, wherein upon the first timing the sampling capacitor integrates the first current signal and the second signal, and upon the second timing the sampling capacitor transfers charge to the load capacitor.

36. The frequency synthesizer of claim 34, wherein the amplifier includes an operational trans-conductance amplifier.

37. A frequency synthesizer comprising:
- a phase detector that receives a reference clock and a feedback clock and generates a plurality of logical signals to represent a phase difference between the reference clock and the feedback clock;
- a charge-pump that converts said logical signals into a first current signal;
- a switch-capacitor loop filter that receives and processes the first current signal and a second current signal to generate a voltage signal;
- a switch-capacitor clock generator working in accordance with the reference clock for generating a plurality of control signals to control the switch-capacitor loop filter; the plurality of control signals including a first control signal, a second control signal, a third control signal, and a fourth control signal that are different from each other, wherein the switch-capacitor loop filter includes:
  a first switch controlled by the first control signal having a first timing, wherein the reference clock is alternating between an even cycle and an odd cycle and the first timing is centered approximately at a first edge of the even cycle,
  a second switch controlled by the second control signal having a second timing,
  a sampling capacitor, and
  a load capacitor; and
- a variable oscillator that receives the voltage signal and generates an output clock; and
- a feedback circuit to receive the output clock and provide the feedback clock to the phase detector.

38. The frequency synthesizer of claim 37, wherein the switch-capacitor loop filter further comprises an alternative sampling capacitor, a third switch controlled by the third control signal having a third timing, and a fourth switch controlled by the fourth control signal having a fourth timing.

39. The frequency synthesizer of claim 38, wherein the first timing does not overlap the third timing, the second timing does not overlap the fourth timing, and the third timing does not overlap the fourth timing.

40. The frequency synthesizer of claim 38, wherein the third timing is centered approximately at a first edge of the odd cycle.

41. The frequency synthesizer of claim 40, wherein upon the third timing the alternative sampling capacitor integrates the first current signal and the second signal, and upon the fourth timing the sampling capacitor transfers charge to the load capacitor.

* * * * *

UNITED STATES PATENT AND TRADEMARK OFFICE
CERTIFICATE OF CORRECTION

PATENT NO. : 7,629,854 B2
APPLICATION NO. : 11/601303
DATED : December 8, 2009
INVENTOR(S) : Lin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 78 days.

Signed and Sealed this

Twenty-first Day of December, 2010

David J. Kappos
*Director of the United States Patent and Trademark Office*